United States Patent
Subramanian et al.

(10) Patent No.: US 10,580,512 B2
(45) Date of Patent: Mar. 3, 2020

(54) STORAGE DEVICE WITH DEBUG NAMESPACE

(71) Applicant: WESTERN DIGITAL TECHNOLOGIES, INC., San Jose, CA (US)

(72) Inventors: Karthik Subramanian, Bangalore (IN); Vinay Vijendra Kumar Lakshmi, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 68 days.

(21) Appl. No.: 15/901,054

(22) Filed: Feb. 21, 2018

(65) Prior Publication Data

US 2019/0259465 A1 Aug. 22, 2019

(51) Int. Cl.
*G11C 29/38* (2006.01)
*G01R 31/317* (2006.01)
*G01R 31/3177* (2006.01)

(52) U.S. Cl.
CPC .......... *G11C 29/38* (2013.01); *G01R 31/3177* (2013.01); *G01R 31/31705* (2013.01)

(58) Field of Classification Search
None
See application file for complete search history.

(56) References Cited

U.S. PATENT DOCUMENTS

| | | | | |
|---|---|---|---|---|
| 8,201,025 B2* | 6/2012 | Moyer | ................ | G06F 11/3648 714/30 |
| 8,966,319 B2* | 2/2015 | Fai | ........................ | G06F 11/362 714/42 |
| 2007/0283191 A1 | 12/2007 | McDonald-Maier et al. | | |
| 2017/0004063 A1 | 1/2017 | Broderick et al. | | |
| 2017/0262228 A1 | 9/2017 | Kanno | | |
| 2018/0260319 A1* | 9/2018 | Thompson | .......... | G06F 12/0246 |
| 2018/0307521 A1* | 10/2018 | Pinto | ................... | G06F 9/45558 |
| 2019/0087331 A1* | 3/2019 | Lappi | ................. | G06F 12/0804 |
| 2019/0095271 A1* | 3/2019 | Lemberg | ............. | G06F 11/0793 |

OTHER PUBLICATIONS

Huffman, Amber, NVM Express: Optimized Interface for PCI Express* SSDs, Intel, Nov. 6, 2015, https://web.archive.org/web/20151106040806/https://nvmexpress.org/wp-content/uploads/NVM-Express-Optimized-Interface-for-PCI-Express-SSDs-SF13_SSDS004_100.pdf.*

SNIA, Solid State Storage Initiative, PCIe SSD 101, Aug. 2013, 32 pages.

NVM Express, History Overview, 5 pages.

NVM Express, Revision 1.3, May 1, 2017, 282 pages.

Amber Huffman, NVM Express, "Optimized Interface for PCI Express" SSDs, 2013, 58 pages.

Hermann Strass, Seagate, "An Introduction to NVMe", 2016, 8 pages.

\* cited by examiner

*Primary Examiner* — Justin R Knapp
(74) *Attorney, Agent, or Firm* — Vierra Magen Marcus LLP

(57) ABSTRACT

An example of a system includes a host interface, a set of non-volatile memory cells assigned a first logical address range, and one or more control circuits coupled to the host interface and coupled to the set of non-volatile memory cells. The one or more control circuits are configured to generate debug data and send the debug data through the host interface in response to a command received through the host interface. The command is directed to a second logical address range, the second logical address range assigned exclusively for debug data.

21 Claims, 13 Drawing Sheets

STORAGE DEVICE WITH DEBUG NAMESPACE

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A data storage device that includes semiconductor memory may be in communication with a host system through an interface. In some cases, more than one data storage device may be in communication with a host system through one or more interfaces. Various standardized interfaces may be used for communication between components including data storage devices and a host system, including Peripheral Component Interface (PCI), PCI express (PCIe), Serial ATA (SATA), Serial Attached SCSI (SAS), Non-Volatile Memory Host Controller Interface Specification (NVMHCIS) or NVM Express (NVMe), and other interfaces.

A data storage device may include one or more control circuits that facilitate operation of semiconductor memory, e.g. a memory controller coupled to a non-volatile memory. Some circuits include an interface for debugging, e.g. specific pins for accessing debugging. An example is an interface specified by the Joint Test Action Group (JTAG) standard. Such an interface provides access to debugging data in an integrated circuit (IC) such as a memory controller.

BRIEF DESCRIPTION OF THE DRAWINGS

Like-numbered elements refer to common components in the different figures.

DETAILED DESCRIPTION

In some examples of the present technology, a data storage device may include one or more control circuits that are configured to provide debug data through a host interface, such as a NVMe interface, rather than through a dedicated debug interface, such as a JTAG interface. In this way, debug data may be accessed without accessing any dedicated physical interface (which may not exist, may not be accessible, or may be difficult to access). For example, in some configurations, e.g. configurations using Ball Grid Array (BGA) to connect dies to a Printed Circuit Board (PCB), after manufacture, accessing debug pins (e.g. JTAG pins) may be difficult or impossible without damaging the memory system.

According to an example, a memory system may include control circuits, such as circuits in an Application Specific Integrated Circuit (ASIC) that are configured to generate debug data, and may include a host interface, such as an NVMe interface, for communication with a host. An NVMe namespace may be allocated as a dedicated debug namespace and communication relating to debugging may use this namespace so that all debug related communication may conform to NVMe protocols and may be handled by a common NVMe driver (i.e. no dedicated debug driver may be needed). A debug application in a host may generate debug commands that follow the format of an NVMe read command. In response to receiving such a command, on-chip debug circuits in a storage device (e.g. in control circuits of the storage device) may generate debug data that is formatted similarly to data read from non-volatile memory. Thus, such exchanges are compatible with an NVMe interface and NVMe driver that can be shared with other traffic including read and write commands and data.

Figure 1:
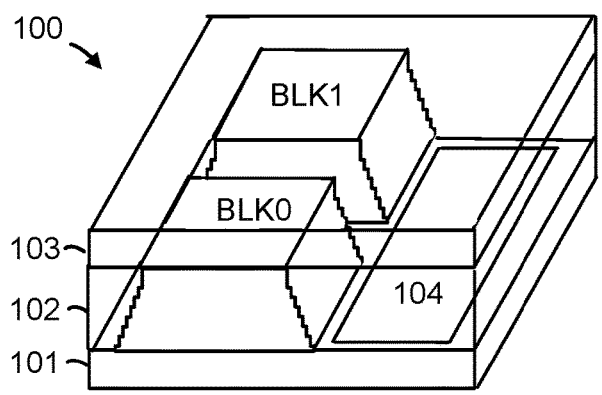
FIG. 1 is a perspective view of a 3D stacked non-volatile memory device.

FIGS. 1-4 describe one example of a memory system that can be used to implement the technology proposed herein. FIG. 1 is a perspective view of a three-dimensional (3D) stacked non-volatile memory device. The memory device 100 includes a substrate 101. On and above the substrate are example blocks of memory cells, including BLK0 and BLK1, formed of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block of memory cells comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
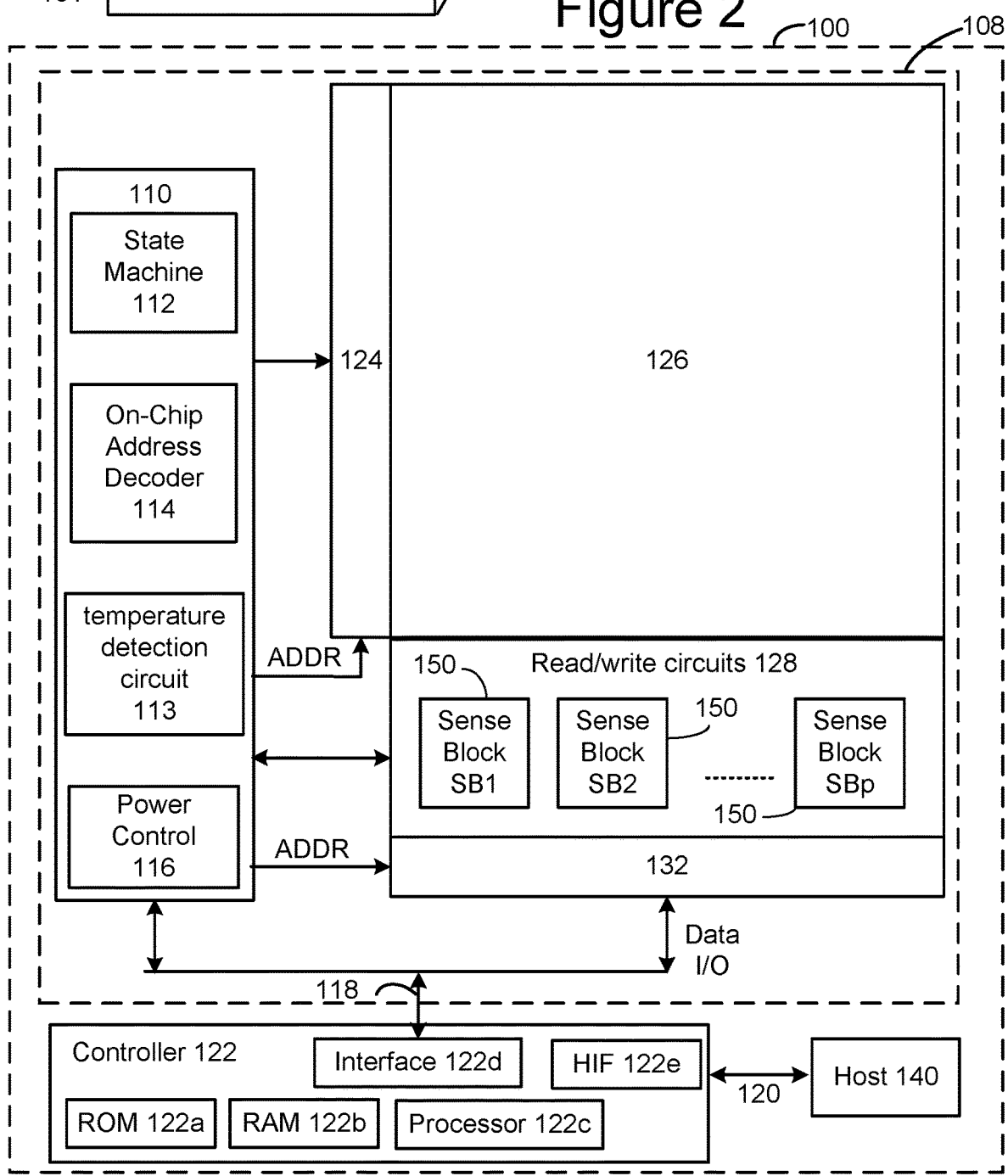
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three-dimensional memory structure 126 of memory cells (such as, for example, a 3D array of memory cells), control circuitry 110, and read/write circuits 128. In other embodiments, a two-dimensional array of memory cells can be used. Memory structure 126 is addressable by word lines via a decoder 124 (row decoder) and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device, such as memory device 100 (e.g., a removable storage card) as the one or more memory die 108. However, in other systems, the Controller can be separated from the memory die 108. In some embodiments, the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 2D or 3D array. The memory structure may comprise a monolithic three-dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and Controller 122 can be considered a circuit or circuits (or a managing circuit) that performs the functions described herein.

Controller 122 (which in one embodiment is an electrical circuit that may be on-chip or off-chip) may comprise one or more processors 122c, ROM 122a, RAM 122b, Memory interface 122d and Host Interface 122e, all of which are interconnected. One or more processors 122C is one example of a control circuit. Other embodiments can use state machines or other custom circuits designed to perform one or more functions. The storage devices (including ROM 122a, RAM 122b) comprises code such as a set of instructions, and the processor 122c is operable to execute the set of instructions to provide the functionality described herein. Alternatively, or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory interface 122d. Host Interface 122e in communication with ROM 122a, RAM 122b and processor 122c, is an electrical circuit that provides an electrical interface between Controller 122 and host 140. For example, Host Interface 122e can change the format or timing of signals, provide a buffer, isolate from surges, latch I/O, etc. Commands and data from host 140 are received by Controller 122 via Host Interface 122e. Data sent to host 140 are transmitted via Host Interface 122e.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array is arranged so that memory cells occupy multiple planes or multiple memory device levels, thereby forming a structure in three dimensions (i.e., in the x, y and z directions, where the z direction is substantially perpendicular, and the x and y directions are substantially parallel to the major surface of the substrate). A three-dimensional memory array or two-dimensional memory array such as memory structure 126 may be considered as a means for non-volatile storage of user data received from a host.

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in they direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM (Resistive RAM) configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
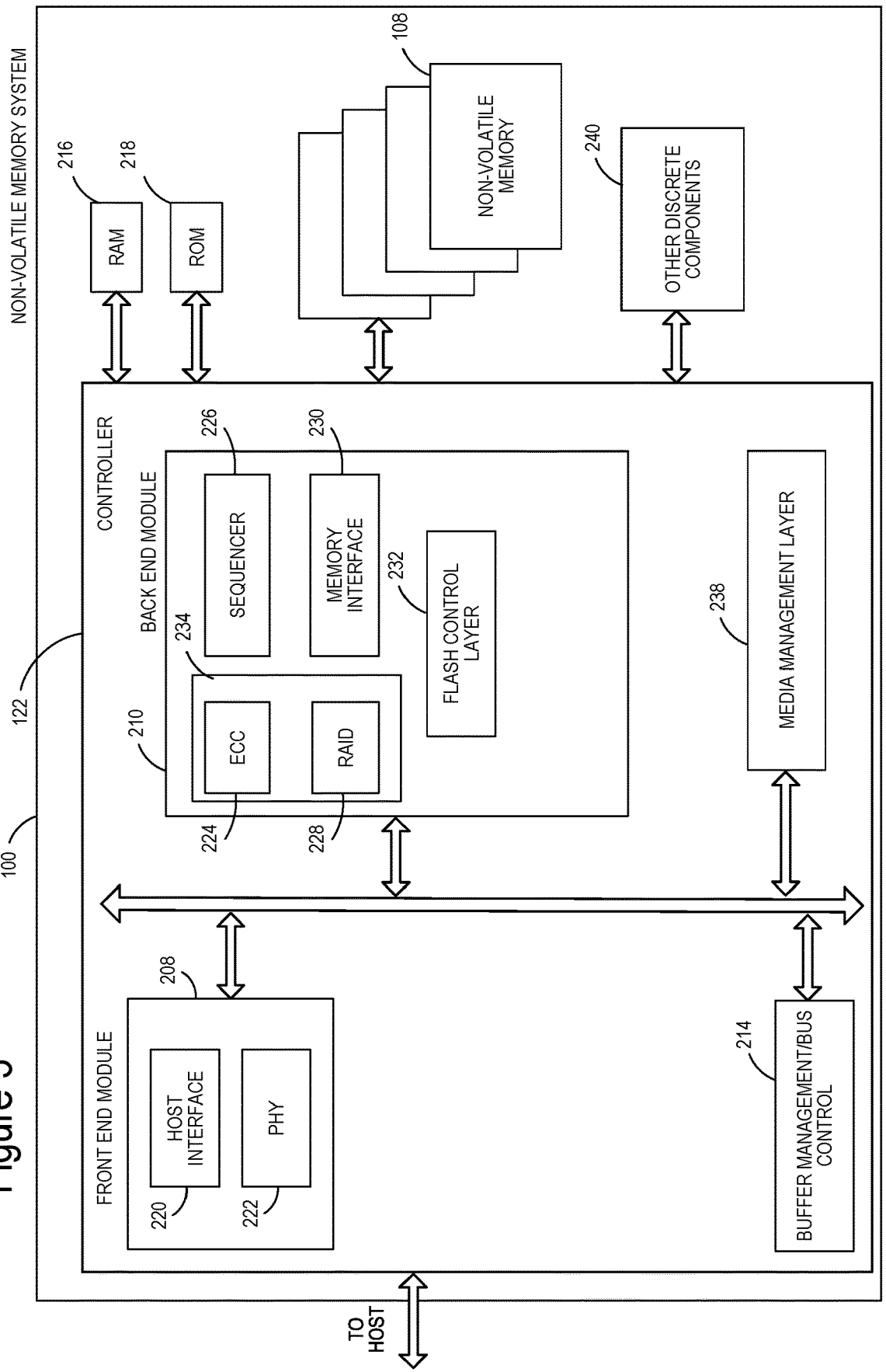
FIG. 3 is a block diagram depicting one embodiment of a Controller.

FIG. 3 is a block diagram of memory system 100, depicting more details of Controller 122. In one embodiment, the system of FIG. 3 is a solid-state drive (SSD). As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed memory cells. Some part of the spare memory cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The communication interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. A SD card may have a host interface such as an NVMe interface and such an SD card may be considered an NVMe SD card, or NVMe-based SD card. In an alternate embodiment, memory system 100 may be part of an embedded memory system. For example, the flash memory may be embedded within the host, such as in the form of a solid-state disk (SSD) drive installed in a personal computer. An SSD may have a host interface such as an NVMe interface and such an SSD may be considered an NVMe SSD.

In some embodiments, memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 122 includes a front-end module 208 that interfaces with a host, a back-end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for Controller 122 to perform the functions described herein. The architecture depicted in FIG. 3 is one example implementation that may (or may not) use the components of Controller 122 depicted in FIG. 2 (i.e. RAM, ROM, processor, interface).

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front-end module 208 includes a host interface 220 and a physical layer interface 222 (PHY) that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 may be a communication interface that facilitates transfer for data, control signals, and timing signals.

Back-end module 210 includes an error correction Controller (ECC) engine, ECC engine 224, that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. ECC engine 224 and RAID module 228 both calculate redundant data that can be used to recover when errors occur and may be considered examples of redundancy encoders. Together, ECC engine 224 and RAID module 228 may be considered to form a combined redundancy encoder 234. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back-end module 210.

Additional components of memory system 100 illustrated in FIG. 3 include media management layer 238, which performs wear leveling of memory cells of non-volatile memory die 108. Memory system 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory structure 126 of memory die 108. The MML 238 may be needed because: 1) the flash memory may have limited endurance; 2) the flash memory structure 126 may only be written in multiples of pages; and/or 3) the flash memory structure 126 may not be written unless it is erased as a block (i.e. a block may be considered to be a minimum unit of erase and such a non-volatile memory may be considered a block-erasable non-volatile memory). The MML 238 understands these potential limitations of the flash memory structure 126 which may not be visible to the host. Accordingly, the MML 238 attempts to translate the writes from host into writes into the flash memory structure 126.

Controller 122 may interface with one or more memory die 108. In in one embodiment, Controller 122 and multiple memory dies (together comprising memory system 100) implement a solid-state drive (SSD), which can emulate, replace or be used instead of a hard disk drive inside a host, as a NAS device, etc. Additionally, the SSD need not be made to work as a hard drive.

Figure 4:
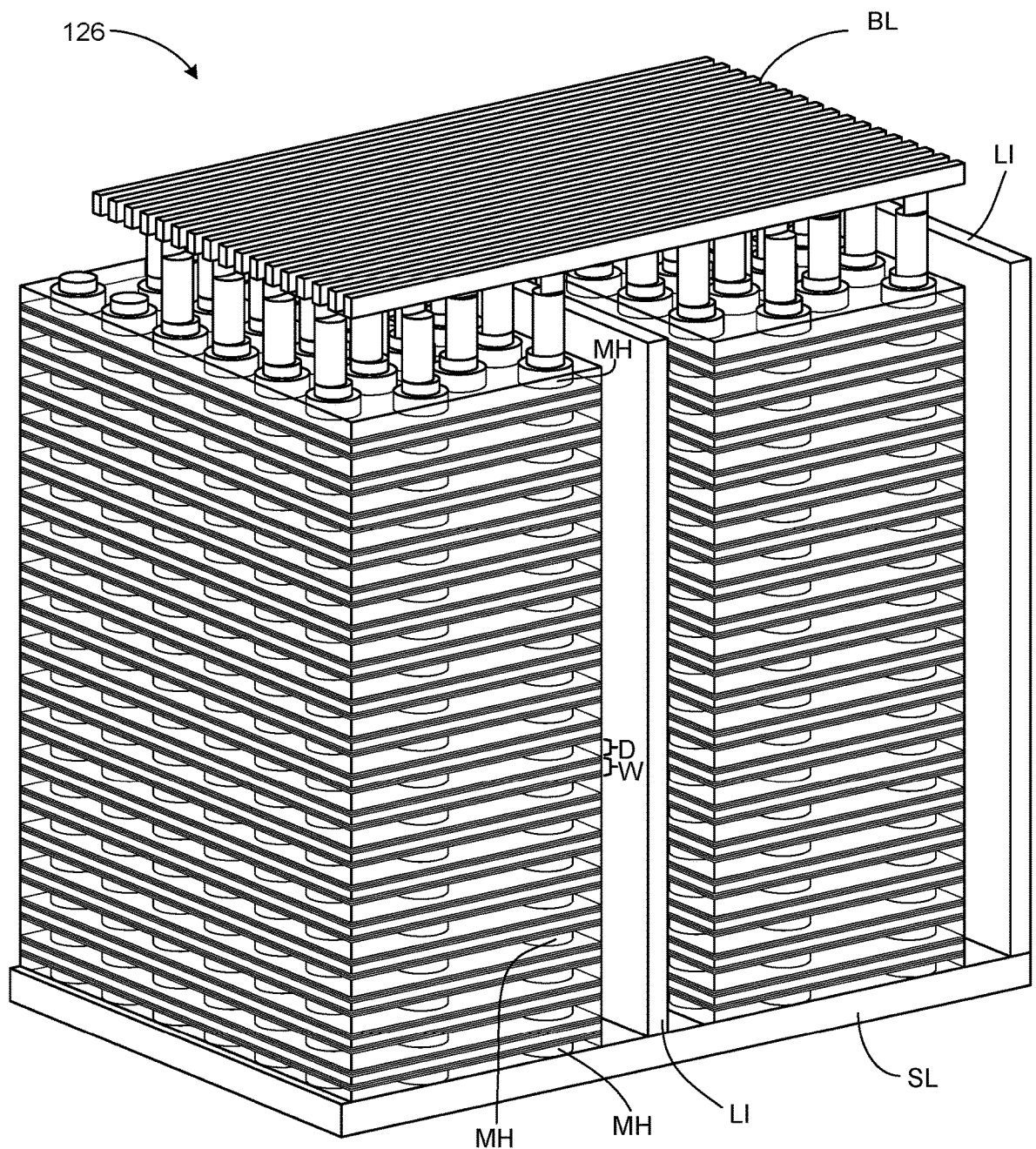
FIG. 4 is a perspective view of a portion of one embodiment of a three-dimensional monolithic memory structure.

FIG. 4 is a perspective view of a portion of a three-dimensional memory structure 126, which includes a plurality of memory cells. For example, FIG. 4 shows a portion of one block of memory. The structure depicted includes a set of bit lines BL positioned above a stack of alternating dielectric layers and conductive layers. For example, for illustration purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data.

While some memories use charge storage elements as memory cells, other memory cells may be used as non-volatile memory cells in a non-volatile memory. For example, Resistive RAM (ReRAM) includes resistive elements that are used to form memory cells. One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming a non-volatile storage system, each memory cell lies between a pair of write lines arranged at right angles to each other, parallel to the memory cell, one above and one below the memory cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse but includes a (continuous or non-continuous) vibration or burst of sound, current, voltage light, or other wave.

In some data storage devices, failures may occur because of hardware failure (e.g. bad physical connections) or other reasons (e.g. bugs in firmware) and some debugging may be performed to identify the sources of such problems so that they can be addressed. A debug interface may be provided to allow debug commands to be sent by an external debug unit and to allow debug data to be sent to such a unit. For example, a dedicated debug port may be provided that allows connection of debugging equipment that accesses on-chip debug circuits to perform debugging. Such access through a debug port may occur, for example, during testing of a non-volatile memory system. A debug port may be formed by dedicated pins that are separate from pins used for operations such as read and write operations. In some cases, such pins may not be accessible after an integrated circuit is incorporated into a larger assembly.

Figure 5:
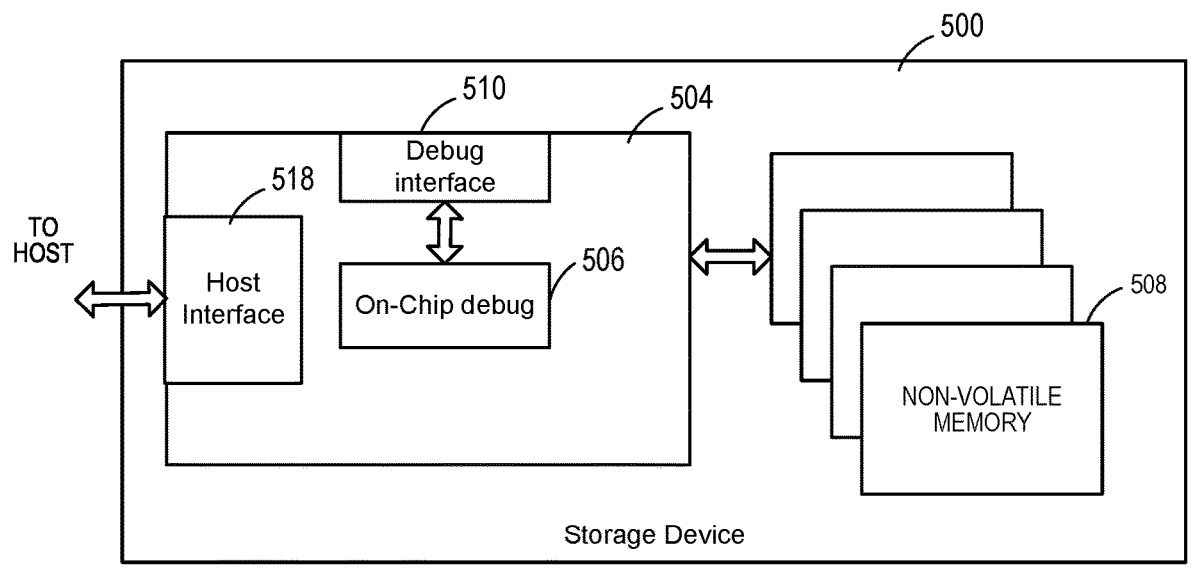
FIG. 5 illustrates an example a storage device with dedicated debug port.

FIG. 5 shows certain features of an example data storage device 500, which includes control circuits 504 and non-volatile memory dies 508. Control circuits 504 may include some or all of the components of memory controller 122 illustrated in FIG. 3, including memory interface circuits, host interface circuits, ECC circuits, etc. Non-volatile memory dies 508 may be formed of one or more memory dies having a structure such as three-dimensional memory structure 126 shown in FIG. 4. Control circuits 504 include on-chip debug circuits 506 that are configured to generate debug data, e.g. data that may be useful in identifying problems and the causes of problems occurring in data storage device 500. On-chip debug circuits are connected to debug interface 510, which forms a dedicated debug interface that is physically separate from host interface 518. Thus, while host interface may include pins that are used for data and address transfer to and from data storage device 500, debug interface 510 includes pins that are only used for debug commands and data and are not used to perform read and write operations.

Figure 6:
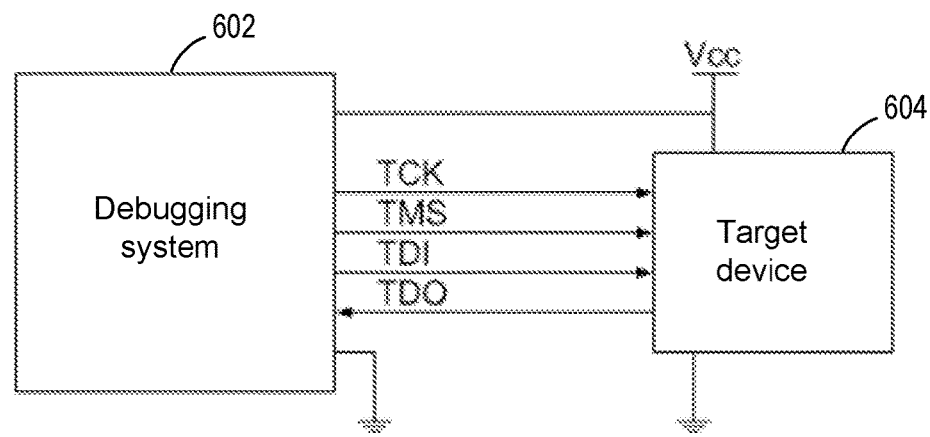
FIG. 6 illustrates JTAG pins of a JTAG port.

An example of a dedicated debug interface is a JTAG interface that may include two, four, or five pins that are dedicated to debugging. FIG. 6 shows an example of a JTAG interface connecting a debugging system 602 with a target device 604. The JTAG interface in this example consists of four pins: TCK (test clock), TMS (test mode select), TDI (test data in), and TDO (test data out). Additionally, Vcc and ground connections are used by on-chip debug circuits such as JTAG circuits. However, these connections may be shared and are not generally provided by dedicated debug pins. A fifth pin may optionally be provided as a reset pin (TRST, or test reset). A reduced pin count JTAG uses two pins, a clock pin (TCLK) and a data pin (TSMC, or test serial data) in what may be referred to as compact JTAG or cJTAG. Details of the JTAG interface are provided by the IEEE 1149.1 standard.

In a data storage system, in some configurations, a dedicated debug port may be used during testing e.g. for boundary scan operations that identify any connection faults. In some configurations, such ports may not be accessible, or may be difficult to access after integrated circuits are incorporated in a product. For example, in some configurations, ball grid array (BGA) bonding may be used to mount an integrated circuit in a storage system in such a manner that accessing debug pins (e.g. JTAG pins) may not subsequently be possible or may be difficult without damaging the storage device. Thus, for example, debug interface 510 of FIG. 5 may not be accessible after manufacture, e.g. where control circuits 504 are formed in an ASIC that is mounted using BGA bonding. Removing such an ASIC to access debug pins may result in destruction of the storage system and is thus generally undesirable.

Figure 7:
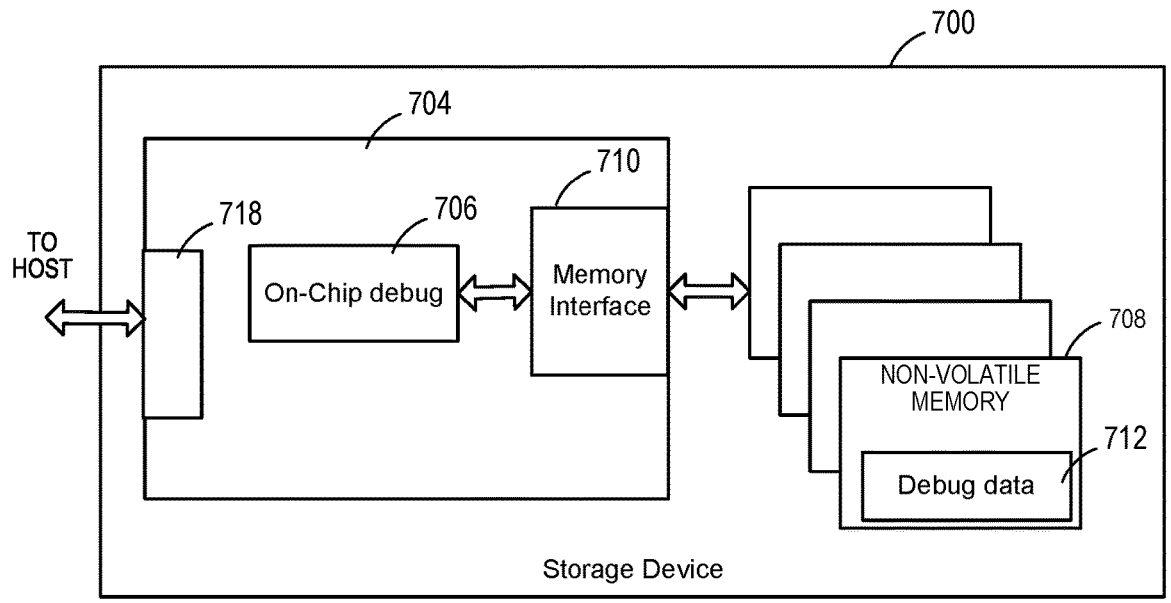
FIG. 7 illustrates a storage device that stores debug data in a non-volatile memory.

An alternative to accessing debug data through a dedicated debug port is to log the debug data, store it in non-volatile memory, and subsequently attempt to read the logged debug data from the non-volatile memory, e.g. after a failure occurs. FIG. 7 shows an example of a storage system 700 that includes non-volatile memory 708 and control circuits 704. Control circuits 704 may include some or all of the components of memory controller 122 illustrated in FIG. 3, including memory interface circuits, host interface circuits, ECC circuits, etc. Non-volatile memory 708 may be formed of one or more memory dies including a set of non-volatile memory cells formed in a structure such as three-dimensional memory structure 126 shown in FIG. 4. Control circuits 704 include on-chip debug circuits 706 that are configured to generate debug data, e.g. data that may be useful in identifying problems and the causes of problems occurring in storage system 700. On-chip debug circuits 706 are connected to memory interface 710 to allow debug data from on-chip debug circuits 706 to be written in non-volatile memory 708. Debug data 712 in non-volatile memory 708 may later be read from non-volatile memory 708 via memory interface 710 and may be transferred to a host (e.g. external debugging equipment) through host interface 718.

Logging debug data and storing it in non-volatile memory for later recovery is not ideal for debugging. Retrieval of debug data requires that the debug data was successfully written and that a read operation can be performed, which may not always be the case, i.e. a failure may affect write operations so that debug data is not correctly stored or may affect subsequent read operations so that the data cannot later be read. Furthermore, accessing debug data in this way is not generally suitable for monitoring a storage system in real time because the debug data is first stored in non-volatile memory and is then read from non-volatile memory, generally some period of time later using external debug equipment, or using a dedicated debug driver in a host that is configured for debugging.

Figure 8:
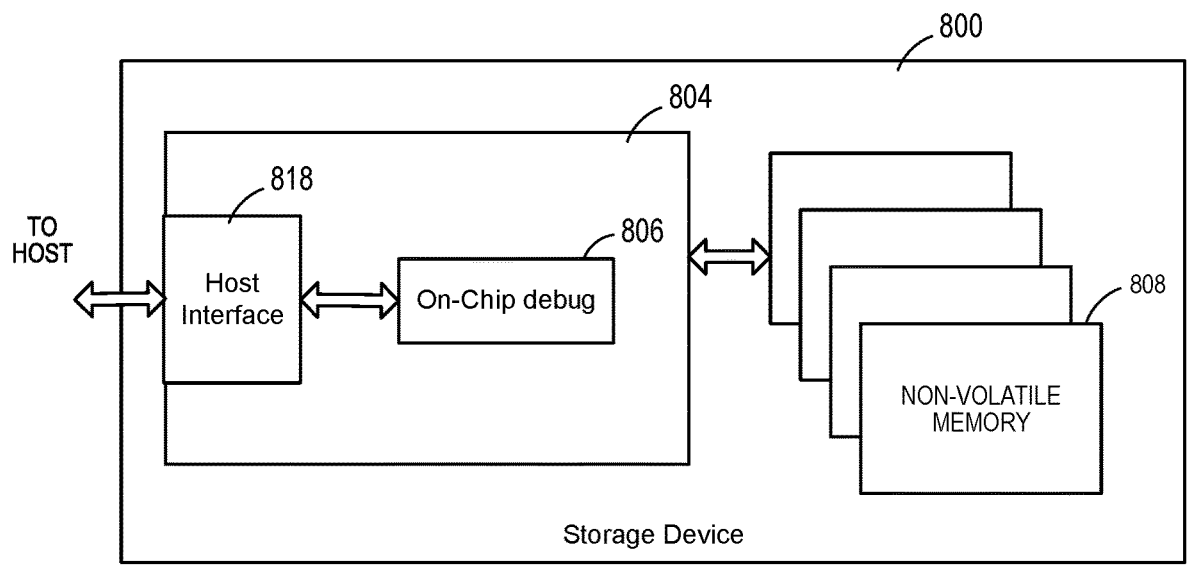
FIG. 8 illustrates an example of a storage device that sends debug data to a host through a host interface.

FIG. 8 illustrates an example of a storage device 800 that employs aspects of the present technology. Storage device 800 includes control circuits 804 and non-volatile memory 808. Control circuits 804 may include some or all of the components of memory controller 122 illustrated in FIG. 3, including memory interface circuits, host interface circuits, ECC circuits, etc. Non-volatile memory 808 may be formed of one or more memory dies including a set of non-volatile memory cells formed in a structure such as three-dimensional memory structure 126 shown in FIG. 4. Control circuits 804 include on-chip debug circuits 806 that are configured to generate debug data, e.g. data that may be useful in identifying problems and the causes of problems occurring in storage device 800. On-chip debug circuits 806 are connected to host interface 818 to send debug data through host interface 818, e.g. in response to a debug command received through host interface 818. On-chip debug circuits 806 may be considered an example of control circuits coupled to the host interface 818 and coupled to the set of non-volatile memory cells of non-volatile memory 808. On-chip debug circuits 806 are configured to generate debug data and to respond to a debug command received through the host interface 818 requesting debug data by sending requested debug data through the host interface 818.

In this example, debug data is generally not stored in non-volatile memory 808 so that failures that affect write operations or read operations directed to non-volatile memory generally 808 do not affect access to debug data. Debug data may be sent in real-time to allow tracing of storage system operations. Thus, in the event of a failure affecting read and write operations to non-volatile memory 808, debug data continues to be sent during and after such a failure. Even in the event of a failure that stops the sending of debug data through host interface 818, e.g. a failure affecting host interface 818 or on-chip debug circuits 806, debug data may be sent up to the time of such failure, which may be sufficient for diagnosing the source of such a failure. On-chip debug circuits 806 may be configured to generate the debug data in response to a debug command and to send the debug data through the host interface 818 without storing the debug data in the set of non-volatile memory cells of non-volatile memory 808. Thus, on-chip debug circuits 806 may be considered a means for generating debug data and for sending the debug data through the host interface in response to a host command directed to a host logical address range assigned to debug data.

In some systems, accessing debug data requires dedicated external debug hardware and/or a dedicated debug driver to communicate with on-chip debug circuits. In contrast, in some aspects of the present technology, a host debug application may use a common driver that is used by other applications, e.g. a driver that is configured for storage system communication including read and write commands. Such a common driver may manage debug communication according to a protocol that is also used for other communication, e.g. a driver additionally configured to manage read and write commands directed to the data storage device for one or more host applications. A common driver may be common to all host applications that are in communication with the data storage device. Using a common driver allows debug data to be accessed without reconfiguring drivers or host hardware. For example, where a storage system is configured for a particular communication protocol, and a common driver for the communication protocol is provided in a host, debug communication may be managed by the common driver and may pass through a host interface in the storage system like other communication passing through the host interface. Such debug communication may include debug commands sent to on-chip debug circuits through host interface circuits and debug data sent from on-chip debug circuits through host interface circuits.

An example of a communication protocol that is configured for communication with a storage system is the NVMe standard. NVMe (Non-Volatile Memory express) or Non-Volatile Memory Host Controller Interface Specification (NVMHCIS) is a protocol adapted for accessing data storage devices attached via a PCI or PCI Express (PCIe) bus. NVMe is generally designed for communication with non-volatile memory such as flash memory and has some advantages over other protocols such as SCSI, SAS, or SATA, that were developed for Hard Disk Drives (HDDs). NVMe is generally defined by specifications generated by industry participants, for example, NVM Express Revision 1.3, published on May 1, 2017. Aspects of the present technology may also be applied using other communication protocols including, for example, SCSI, SAS, and SATA.

Figure 9:
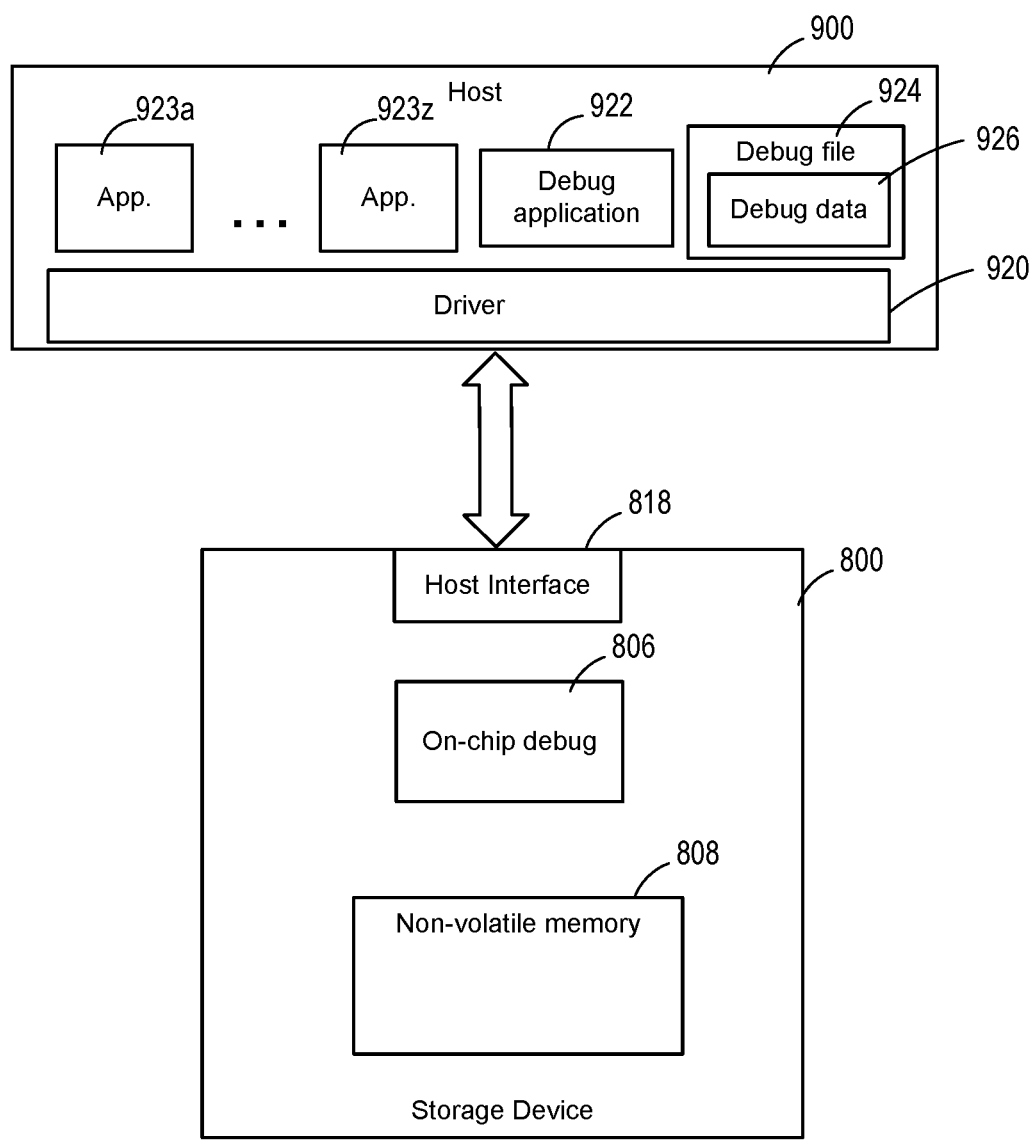
FIG. 9 illustrates an example of a storage device coupled to a host.

FIG. 9 shows an example of storage device 800 of FIG. 8 coupled to a host 900. Host 900 includes a common driver 920 (e.g. an NVMe driver, or other such driver that is configured for communication with storage devices) that is in communication with host interface 818 of storage device 800 according to a communication protocol (e.g. NVMe protocol, or other such protocol). Host 900 includes a debug application 922, which communicates with on-chip debug circuits 806 through common driver 920 and host interface 818. Common driver 920 and host interface host interface 818 are also used by host applications such as applications 923a-z of host 900. Applications 923a-z may be any applications running on host 900 that write and/or read data to/from storage device 800. Applications 923a-z may include, for example, camera applications, music applications, video applications, document preparation and/or viewing applications, games, social media applications, and/or other applications that may access a storage device. The type and number of such applications may vary according to the type of host and the purpose or purposes for which it is used. Commands sent by applications 923a-z are sent to common driver 920 and via host interface 818 to provide access to non-volatile memory 808. Commands from applications 923a-z may include read and/or write commands directed to non-volatile memory 808. Data read from non-volatile memory 808 may be sent through host interface 818 and common driver 920 to applications 923a-z. Commands generated by debug application 922 are also sent to common driver 920 and through host interface 818 to on-chip debug circuits 806. Debug data generated by on-chip debug circuits 806 is sent through host interface 818 to debug application 922. Debug data sent to debug application 922 may be stored by debug application 922 in debug file 924 in host 900. Thus, debug application 922 may be considered a means for receiving and storing the debug data in the host. FIG. 9 shows debug data 926 stored in debug file 924. Such debug data may be logged over a period of time and stored in debug file 924 to allow it to be accessed subsequently, for example, after a failure occurs. In contrast to storing such debug data within a storage device (e.g. in non-volatile memory 808 of storage device 800), storage in debug file 924 in host 900 allows debug data to be accessed even after a failure that would prevent access to a copy stored in the storage device.

In examples where the NVMe protocol is used for communication between a host and a storage device (NVMe interface), a dedicated NVMe namespace may be configured for debug purposes. A NVMe namespace is a logical address range, so that configuring dedicated debug namespace includes assigning a particular logical address range of the data storage device for debug data. This logical address range is then exclusively available for debug purposes and is unavailable for other purposes, e.g. unavailable for user data. Debug commands are then directed to the debug namespace assigned exclusively for debug data. Such a debug command may include one or more addresses within the debug namespace corresponding to debug data to be generated. A host command directed to a host logical address range (e.g. namespace) assigned to debug data may be considered a debug command in the examples discussed here though it will be understood that such commands may conform to a standard such as the NVMe standard and may appear as read commands directed to the debug namespace.

Figure 10A:
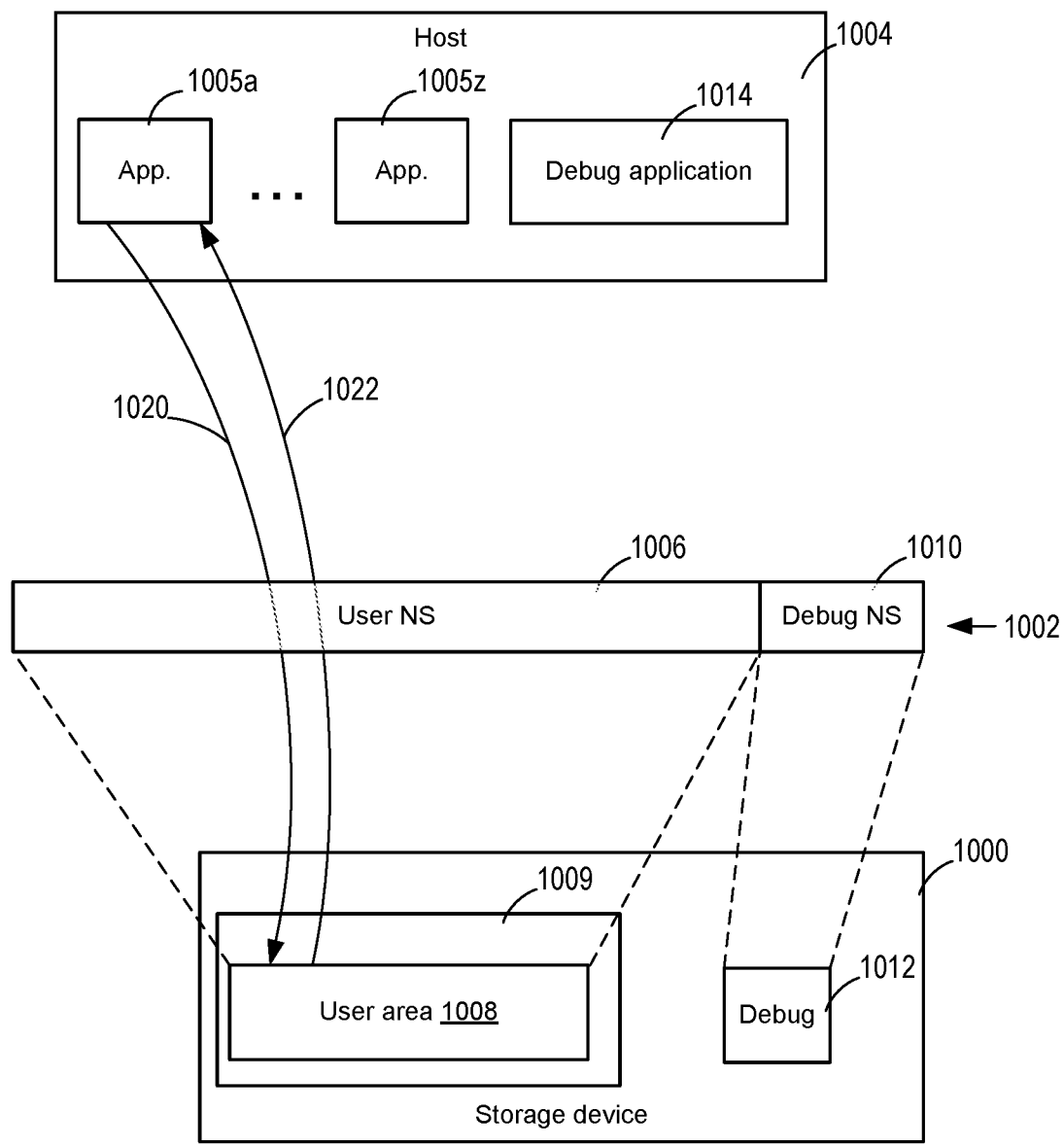
FIGS. 10A-C illustrates examples of use of a debug namespace by a debug application.

FIG. 10A shows an example of a storage device 1000 that is assigned a host logical address range 1002 by a host 1004. Host 1004 includes applications 1005a-z and debug application 1014, e.g. applications 923*a-z* and debug application 922 of FIG. 9. Host logical address range 1002 is configured as two namespaces in this example (a logical address range may be configured as more than two namespaces in other examples). A user namespace 1006 ("user NS") is a logical address range that is assigned for user data. Host applications 1005*a-z* may direct read and write commands to user namespace 1006. A user area 1008 in non-volatile memory 1009 of storage device 1000 is mapped to user namespace 1006 according to a logical to physical mapping scheme. Thus, some or all non-volatile memory cells in a set of non-volatile memory cells of non-volatile memory 1009 in storage device 1000 may be configured as a user area 1008.

FIG. 10A shows an example of a read command 1020, that is generated and sent by application 1005*a* and is directed at user namespace 1006, i.e. it is directed to one or more logical addresses that are assigned to user namespace 1006. These logical addresses are in turn mapped to physical addresses in user area 1008 of non-volatile memory 1009. In response to read command 1020, storage device 1000 reads data from the identified physical addresses in user area 1008 of non-volatile memory 1009 and performs data transfer 1022 to application 1005*a*.

In addition to user namespace 1006, FIG. 10A shows debug namespace 1010. A debug namespace 1010 ("Debug NS") is a logical address range that is assigned exclusively for debug data. Debug contexts 1012 in storage device 1000 are mapped to debug namespace 1010 according to a mapping scheme. For example, a given address within debug namespace 1010 may be assigned to a specific debug context. While some physical portion of a non-volatile memory such as non-volatile memory 1009 may be mapped to a debug namespace in some examples (i.e. some non-volatile memory cells in a set of non-volatile memory cells may be assigned for debug data), in some cases (as shown in FIG. 10A), some or all logical addresses of a debug namespace may remain unmapped to any physical addresses in a storage device. Thus, for example, debug namespace 1010 is mapped to debug contexts 1012 and is not mapped to any physical portion of non-volatile memory 1009.

When a debug command is received that is directed to the debug namespace 1010, instead of causing a read of non-volatile memory cells of a non-volatile memory 1009, the debug command may cause generation and sending of debug data from storage device 1000. On-chip debug circuits in storage device 1000 (e.g. on-chip debug circuits 806) may respond to debug commands directed to debug contexts 1012 by generating debug data specified by the debug commands and sending the debug data back to the debug application. This may appear as a transfer of data associated with debug namespace 1010 to host 1004 and may be handled in the same way as a transfer of data in response to a read command (e.g. data transfer 1022 in response to read command 1020) directed to user namespace 1006 (e.g. according to NVMe protocol). Thus, a common driver (e.g. common driver 920) may be used for accessing stored data in user area 1008 of non-volatile memory 1009 in storage device 1000 and debug data generated by on-chip debug circuits that is not stored in non-volatile memory 1009, e.g. debug data that is generated and sent in response to a command without being stored in non-volatile memory.

Figure 10B:
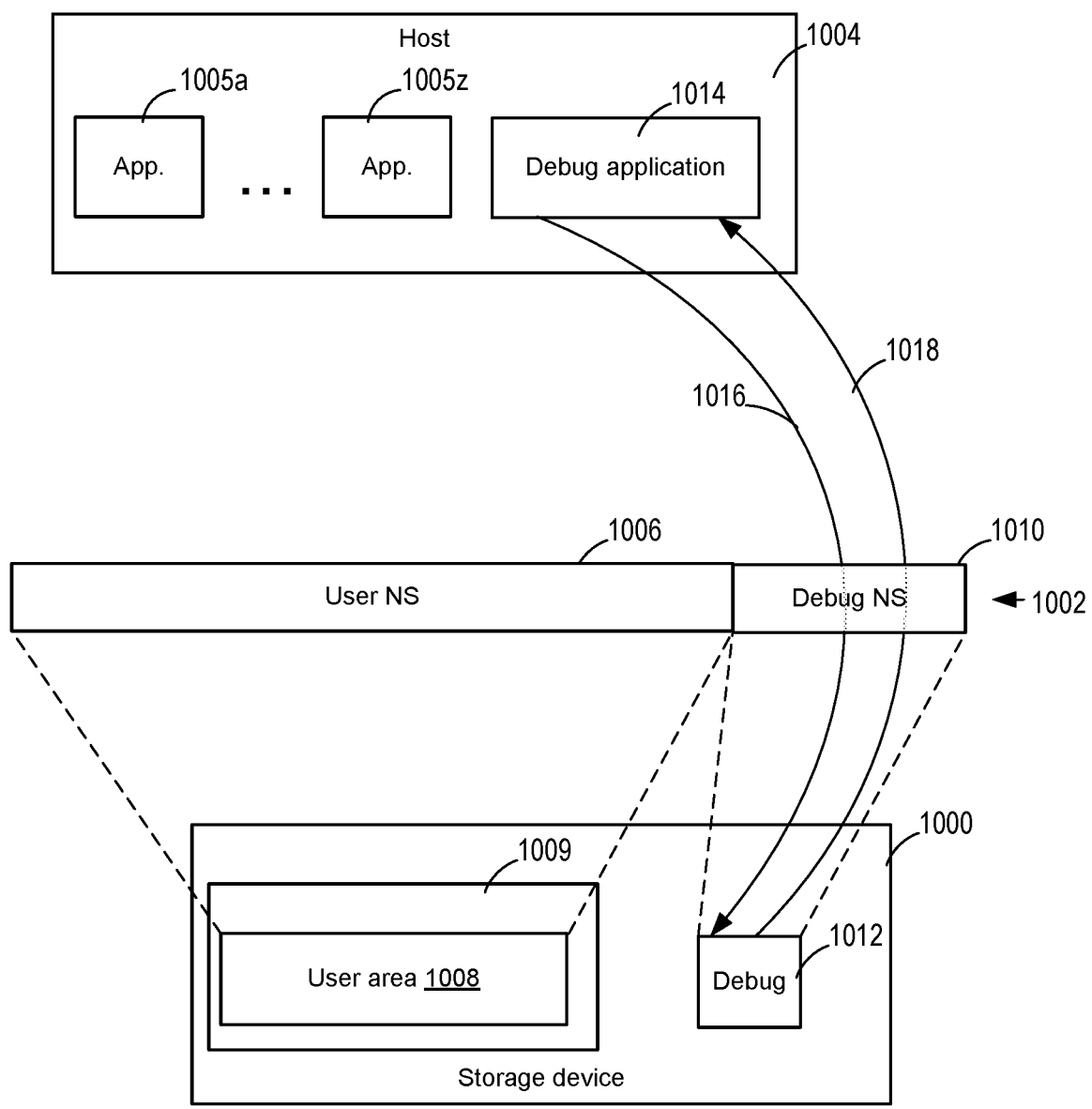

FIG. 10B shows an example of debug application 1014 in host 1004 sending a debug command 1016, which is directed to debug namespace 1010 (not user namespace 1006). Because debug command 1016 is directed to debug namespace 1010 instead of user namespace 1006, it is mapped to debug contexts 1012 and results in generation of debug data and sending of debug data 1018 to debug application 1014. Debug application 1014 may then save debug data in host 1004, e.g. in a debug file such as debug file 924. It will be understood that debug data obtained in this manner may be used by a debug application such as debug application 1014 to identify problems, diagnose reasons for failures, and any other debugging purpose. The present technology is not limited to using debug data for any particular purpose.

A debug command such as debug command 1016 may be in the format of a read command directed to one or more logical addresses in debug namespace 1010. While read commands such as read command 1020 of FIG. 10A result in reading data from non-volatile memory 1009 and transfer of read data to an application in host 1004 (e.g. data transfer 1022 to application 1005*a* shown in FIG. 10A), a similar command such as debug command 1016 directed to debug namespace 1010 does not result in reading data from non-volatile memory 1009. Instead, such a command directed to debug namespace 1010 results in generation of debug data and transfer of debug data to debug application 1014. Such generation and transfer of debug data can be performed without accessing non-volatile memory 1009 and thus without the delay that would be incurred if non-volatile memory 1009 was accessed.

Figure 10C:
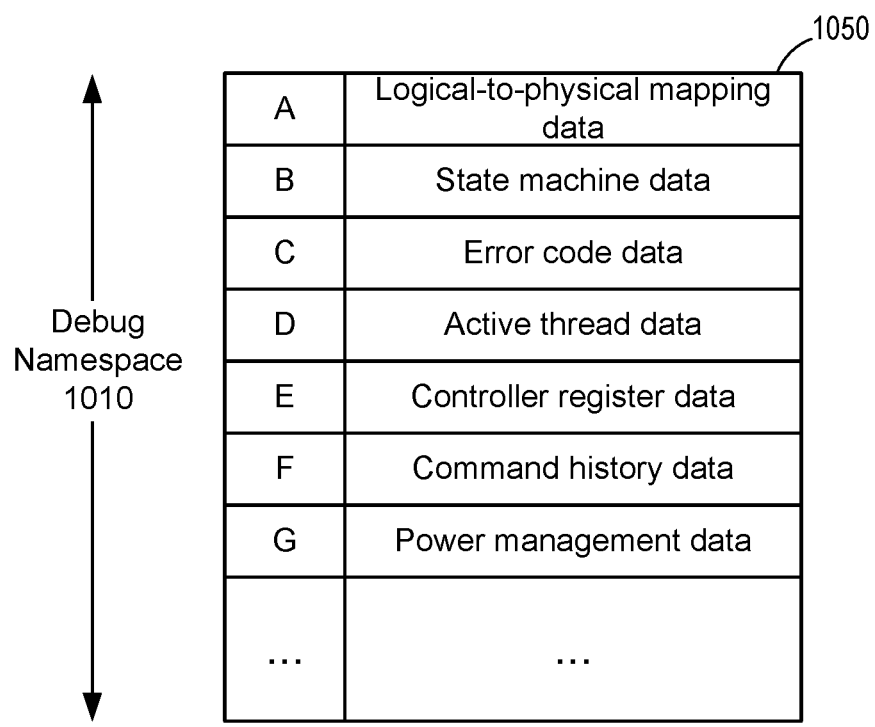

Using the format of a read command, a debug command may be directed to particular debug data by specifying one or more logical addresses within a debug namespace. For example, the logical address range of a debug namespace may be divided with different logical address ranges corresponding to different debug data. FIG. 10C shows an example of a table 1050 that specifies such a mapping of a debug namespace 1010 to different debug data. Thus, debug namespace 1010 includes logical address ranges A, B, C, D, E, F, G . . . (the number of such ranges may depend on the type of data storage system and the type of failures expected). In this example, logical address range A corresponds to logical-to-physical mapping data, logical address range B corresponds to state machine data, logical address range C corresponds to error code data, logical address range D corresponds to active thread data, logical address range E corresponds to controller register data, logical address range F corresponds to command history data, and logical address range G corresponds to power management data. Additional logical address ranges may also be provided and table 1050 simply provides a few examples of the types of debug data that may be accessed using a debug namespace. Within each such logical address range, particular logical addresses may additionally specify which debug data is requested. For example, state machine data of logical address range B may include data for multiple state machines and particular state machines of interest may be specified by individual logical addresses, or address ranges. Similarly, specific error codes, or specific controller registers may be specified by indicating specific logical addresses. In other examples, one or more of the logical address ranges may consist of a single logical address, which may be the minimum unit for requesting and transferring debug data.

A debug command such as debug command 1016 may be parsed by an on-chip parsing unit, e.g. by parsing circuits coupled to on-chip debug circuits 806. Logical addresses of the debug command may be used to identify the debug data to be generated (e.g. by using a lookup table that may be similar to table 1050. A debug application such as debug application 1014, or debug application 922, may have a similar table so that debug commands may be generated that specify the desired debug data using logical addresses in a manner that is compatible with a common driver and that allows on-chip debug circuits to identify the debug data to be generated and returned.

Interactions between a debug application in a host and on-chip debug circuits may be performed periodically in some cases or may be triggered by particular triggering events. Thus, interactions between debug application 992 and on-chip debug circuits 806, and between debug application 1014 and on-chip debug circuits of storage device 1000 may occur according to a predetermined schedule, or in response to particular triggering events.

Figure 11:
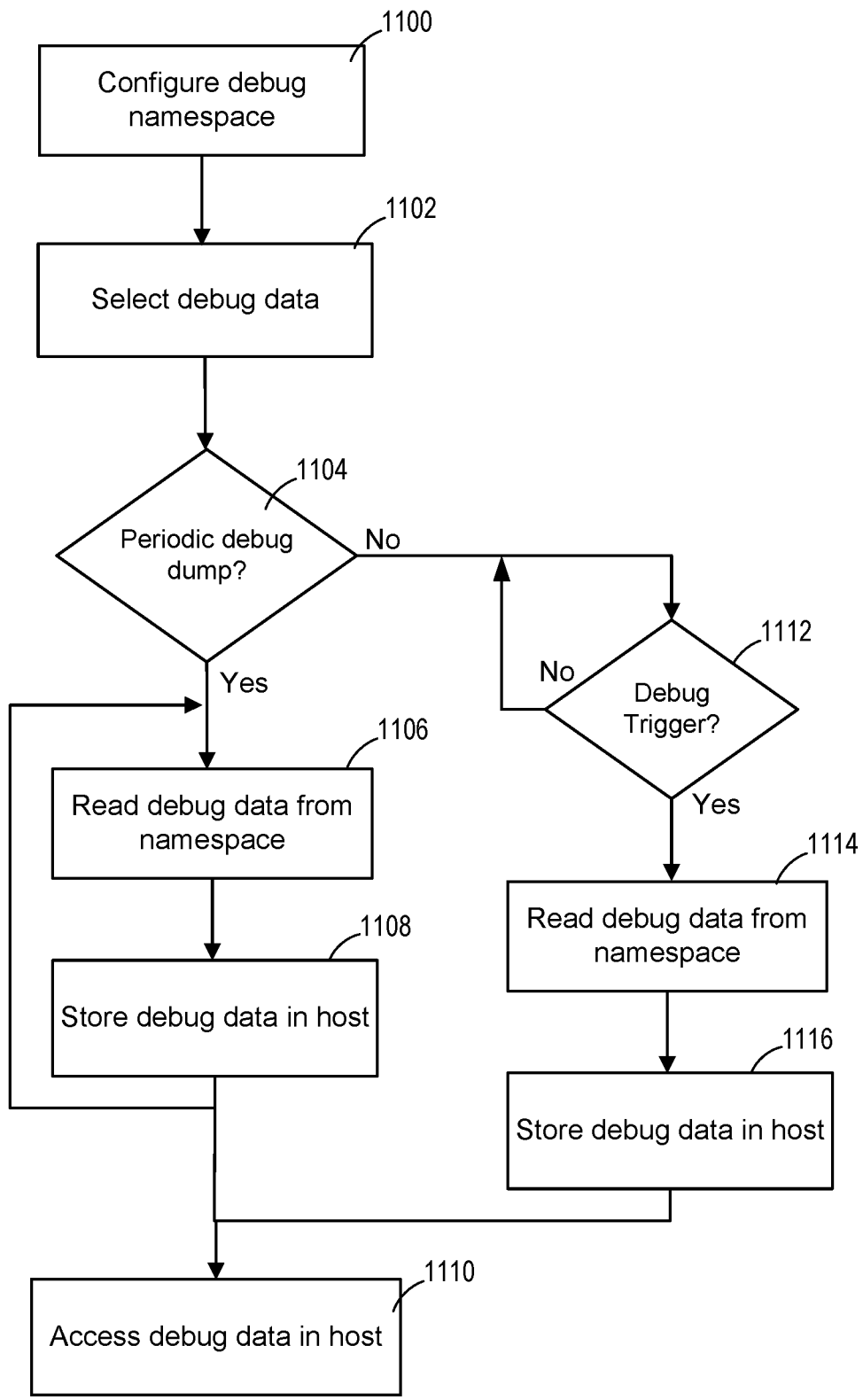
FIG. 11 illustrates an example of using a debug namespace.

FIG. 11 illustrates some debug operations including interactions between a debug application in a host (e.g. debug application 922 of FIG. 9 or debug application 1014 of FIG. 10) and on-chip debug circuits (e.g. on-chip debug circuits 806) in a storage device (e.g. storage device 800 or storage device 1000). FIG. 11 shows two alternatives for timing of transfer of debug data from a storage device to a debug application in a host. Other timing options may also be implemented.

A debug namespace is configured 1100, for example by configuring a logical address range of a data storage device for debug data. This namespace may appear as a dummy file to the host file system (e.g. FAT 32 file of a chosen size such as a small file of, for example, 128 kB). This may be performed as part of an initial configuration of a storage device when it is connected to a host. For example, some initial handshaking routine may establish that on-chip debug circuits in a storage system are configured to implement debug communication using a debug namespace and a namespace may be configured accordingly.

Debug data is selected 1102 according to the purpose of debugging. It will be understood that a wide variety of debug data may be generated and only a subset of all such data may be desired at any given time. For example, a logical address range of a debug namespace may be mapped to different debug contexts with any given logical address specifying a debug context of interest so that different debug data is generated according to the logical addresses specified in a debug command. Debug data may be sent periodically, and a determination is made as to whether to perform a periodic debug dump 1104 to dump such data from a storage device to the host. If a periodic debug dump is selected then data is read from the namespace 1106 (e.g. by sending a debug command from a debug application in the host, through a host interface, the debug command directed to the logical address range of the debug namespace). In response to receiving the debug command directed to the logical address range, debug data may be generated in the data storage device and sent through the host interface to the debug application. The debug data is stored in the host 1108 (e.g. in a debug file). This sequence is repeated so that debug data may be accumulated in the host over a range of time to generate a log in the host that remains accessible even after a failure in the storage system.

In some cases, successive debug commands may be directed to different debug contexts so that a broad range of variables may be logged for debugging. The timing of periodic dumping is configurable and may be, for example, in the millisecond range (e.g. every 100 milliseconds), or every second, or at some other interval. Debug data in the host is accessed 1110, e.g. after a failure or on an ongoing basis.

Where periodic dumping is not selected 1104, a determination is made as to whether a debug trigger has occurred 1112. If a trigger has not occurred, then the determination is repeated, and this loop continues until a trigger is detected. When a trigger occurs, a debug dump may be performed so that debug data is read from the debug namespace 1114 and the debug data is stored in the host 1116, e.g. as described above with respect to periodic debug dumping. This debug data is then accessed in the host 1110 as with the periodically generated debug data. A trigger for such a debug dump may be an input from a debug application user, a trigger corresponding to some testing being performed, a trigger generated in response to an increased likelihood of failure (e.g. a pattern of commands correlated with failures), or some other trigger.

Figure 12:
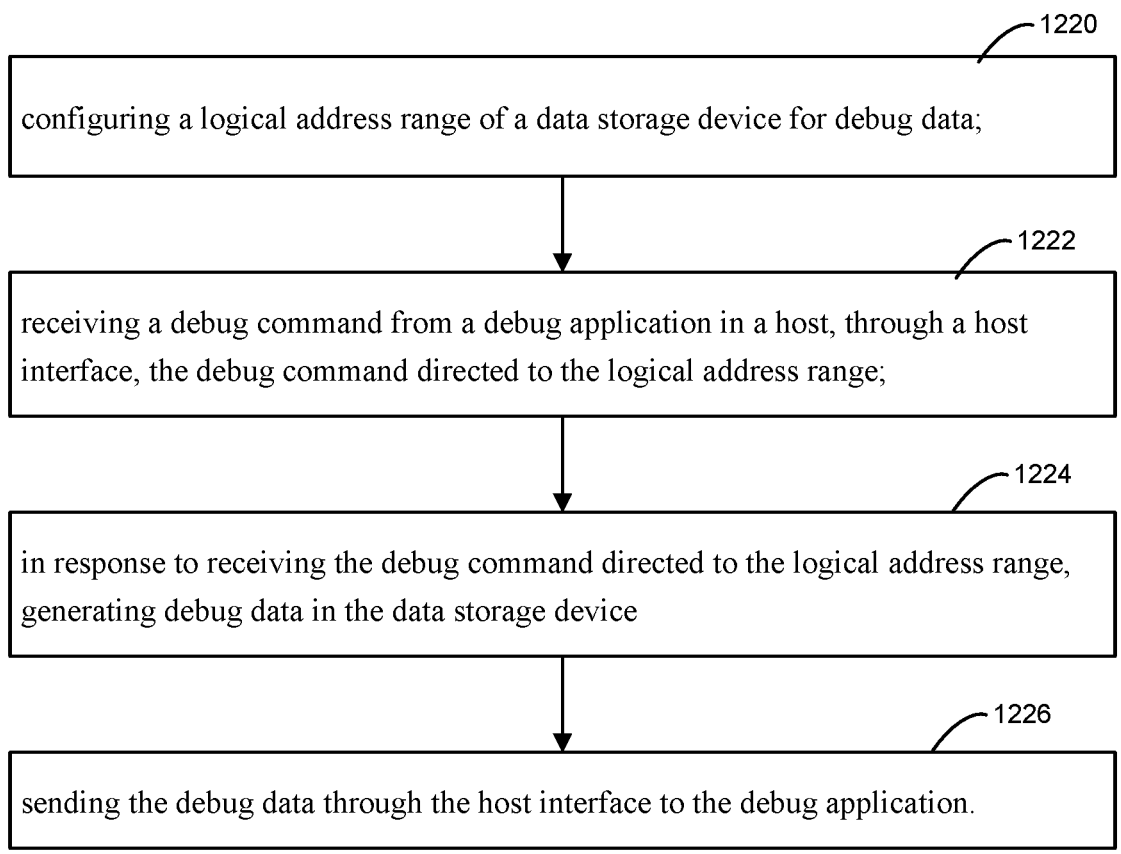
FIG. 12 illustrates an example of a method of debugging a data storage device.

FIG. 12 provides another illustration of how aspects of the present technology may be implemented in an apparatus as described above, for example, between host 900 and storage device 800 of FIG. 9. In particular, FIG. 12 shows a method of debugging a data storage device that includes configuring a logical address range of a data storage device for debug data 1220 and receiving a debug command from a debug application in a host, through a host interface, the debug command directed to the logical address range 1222. The method further includes, in response to receiving the debug command directed to the logical address range, generating debug data in the data storage device 1224; and sending the debug data through the host interface to the debug application 1226.

In some examples, it may be desirable to restrict access to debug data. Thus, while access to a debug namespace may be performed using debug commands that are sent and received as NVMe compliant read commands directed to a debug namespace, it may be desirable to prevent unwanted reading of data from the debug namespace. Some security features may be provided for this purpose so that only a debug command from a properly authenticated debug application generates a response. If a read command directed to the debug namespace is received from another entity that is not properly authenticated, no response may be provided (i.e. read may be blocked), or some garbage data may be sent. Key-based encryption or other security features may be used to secure a debug namespace to prevent unauthorized use. Any suitable security system may be used to ensure a secure communication link between the debug application in the host and the one or more control circuits, including systems that may be used for other purposes such as securing user information. Such security may ensure that only the debug application in the host can access the NVMe namespace. Examples of systems that may be used include Opal, Opalite, and Pyrite, which are suitable for implementation in storage systems using an NVMe interface.

Figure 13:
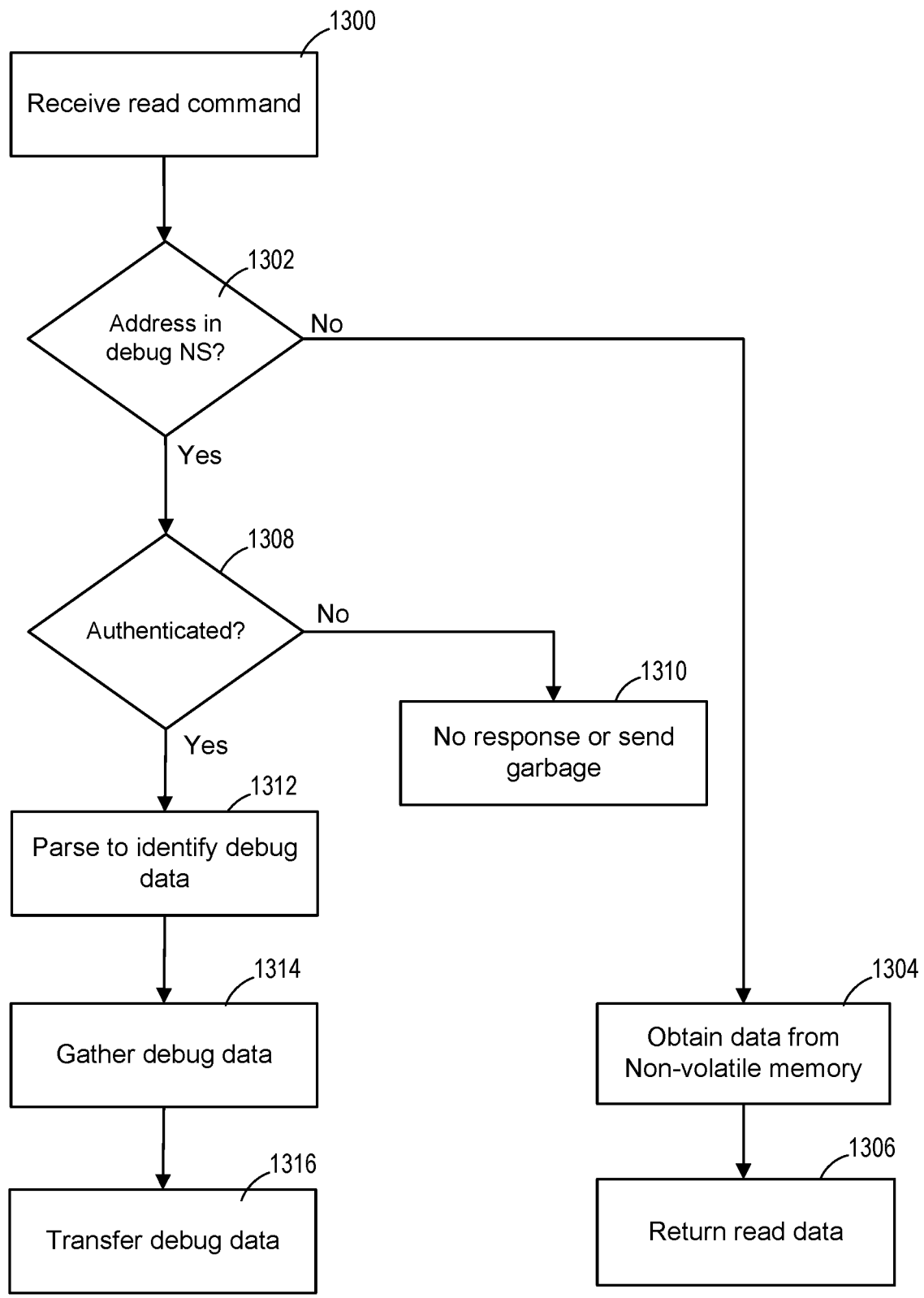
FIG. 13 illustrates an example of handling a read command by a data storage device.

FIG. 13 illustrates how a new read command may be handled by a data storage device such as storage device 800 of FIGS. 8 and 9, or storage device 1000 of FIGS. 10A-B. A read command is received 1300 and a determination is made 1302 as to whether one or more address in the read command is in the debug namespace (e.g. debug namespace 1010). For example, a read command may be parsed to identify the address or addresses it contains. If the address is not in the debug namespace then the address is in the user namespace (e.g. user namespace 1006) since, in this example, there are only two namespaces for the data storage device. In other examples there may be multiple namespaces, e.g. multiple user namespaces. A read command directed to the user namespace results in execution of the read command including obtaining data from non-volatile memory 1304 and returning the read data 1306 to the host (e.g. to an application such as application 1005*a* in host 1004 as shown in FIG. 10A). Where a read command is directed to one or more address in a debug namespace, then the command is treated as a debug command that does not require reading of data from non-volatile memory. In order to prevent unauthorized access to debug data, an authentication procedure may be applied to any access to an address in the debug namespace, e.g. the identity of the sender of the command may be confirmed using a public key associated with the private key of a debug application such as debug application 1014. A command directed to the debug namespace may be authenticated 1308 and when authentication fails then the data storage device may provide no response or send garbage 1310. When a command is successfully authenticated the command is parsed 1312 to identify debug data specified in the command, e.g. by consulting a table such as table 1050. The debug data that is identified is gathered 1314, e.g. by copying contents of registers, tables, or otherwise obtaining the specified debug data. The debug data is then transferred 1316 to the debug application. Debug data may be secured prior to transfer so that it can only be read by the debug application.

Figure 14:
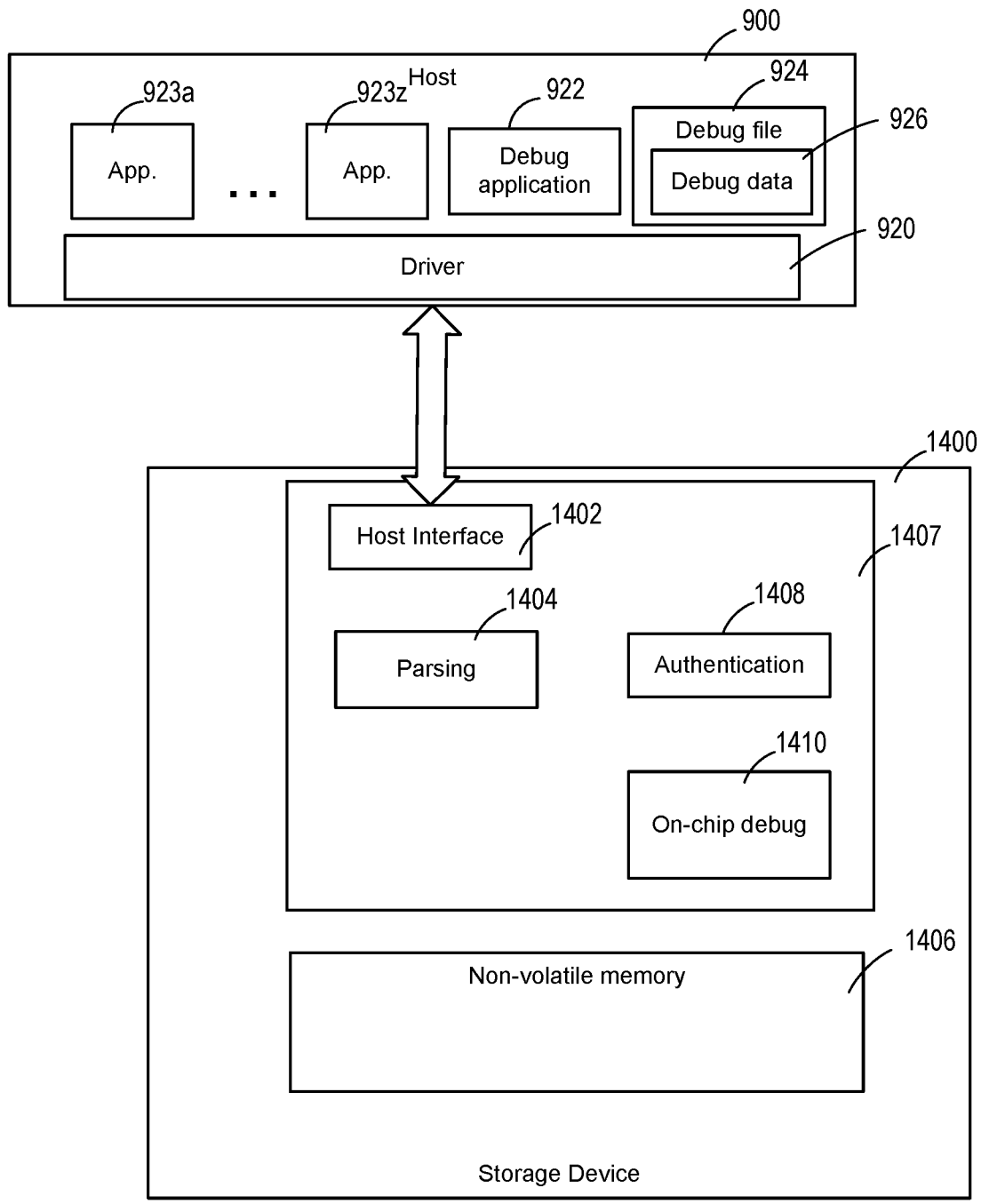
FIG. 14 illustrates an example of data storage device components.

FIG. 14 illustrates an example of hardware that is configured to implement aspects of the process illustrated in FIG. 13. FIG. 14 shows data storage device 1400 in communication with host 900. Host 900 was previously shown in FIG. 9 and includes applications 923*a-z* and debug application 922 that communicate with storage device 1400 using common driver 920, e.g. common driver 920 may be an NVMe driver that communicates according to the NVMe protocol. Debug file 924 in host 900 stores debug data 926. Storage device 1400 includes non-volatile memory 1406 and control circuits 1407 (e.g. non-volatile memory 808 and control circuits 804 of FIG. 8). Control circuits 1407 include host interface 1402 that is configured to interface with common driver 920 of host 900 (e.g. configured for NVMe communication).

Parsing unit 1404 (parsing circuit) is coupled to host interface 1402 and is configured to parse commands such as read commands received from host 900. For example, parsing unit 1404 may parse a read command to identify a logical address or addresses specified by the read command and to identify a corresponding namespace, e.g. a user namespace or debug namespace. Thus, parsing unit 1404 may use a logical address to identify a received read command as a debug command. Parsing unit 1404 may further determine from a logical address of a debug command which debug data is requested by the command, e.g. by consulting a table such as table 1050 shown in FIG. 10C.

Authentication unit 1408 (authentication circuit) is provided to authenticate certain commands, for example, debug commands to ensure that the sender of the command has appropriate permission. For example, authentication unit 1408 may authenticate a debug command to ensure that it was sent by debug application 922 and not some other sender. Authentication unit may be shared with other systems and may not be limited to authenticating debug commands (e.g. authentication unit may also be responsible for authenticating access to certain secure portions of non-volatile memory 1406).

On-chip debug circuits 1410 are configured to gather debug data identified by parsing unit 1404 from a logical address in a command received via host interface 1402 (after authentication by authentication unit 1408). Such debug data is returned (e.g. to debug application 922) through host interface 1402.

Aspects of the present technology may be applied to a range of debug contexts to allow a wide range of debug data to be obtained in a secure manner. Examples of such debug data may include logical-to-physical address mapping data (which may not otherwise be visible outside a storage device), device state data including state machine variables, error codes, and active thread information (e.g. indicators of which threads are active at given times). Debug data may include controller register information and power management data, including any changes in power states such as transitions to and from low-power modes. Debug data may also include command data such as a log of host commands and/or an indicator of the last host command. Thus, on-chip debug circuits may be configured to generate debug data that includes at least one of: logical-to-physical mapping data, state machine data, error code data, active thread data, controller register data, command history data, and power management data.

An example of a system includes: a host interface; a set of non-volatile memory cells assigned a first logical address range; and one or more control circuits coupled to the host interface and coupled to the set of non-volatile memory cells, the one or more control circuits configured to generate debug data and send the debug data through the host interface in response to a command received through the host interface.

The one or more control circuits may be configured to generate debug data and send the debug data through the host interface without storing the debug data in the set of non-volatile memory cells. The host interface may be a Non-Volatile Memory express (NVMe) interface. The second logical address range forms an NVMe namespace that is configured as a debug namespace. The command may include one or more addresses within the debug namespace corresponding to debug data to be generated. The host interface may be coupled to a host and the one or more control circuits may be configured to communicate with a debug application in the host through an NVMe driver in the host. The debug application may be configured to receive the debug data and to store the debug data in a debug file in the host. The system may include a secure communication link between the debug application and the one or more control circuits. The one or more control circuits may be configured to generate debug data that includes at least one of: logical-to-physical mapping data, state machine data, error code data, active thread data, controller register data, command history data, and power management data.

An example of a method of debugging a data storage device includes: configuring a logical address range of a data storage device for debug data; receiving a debug command from a debug application in a host, through a host interface, the debug command directed to the logical address range; in response to receiving the debug command directed to the logical address range, generating debug data in the data storage device; and sending the debug data through the host interface to the debug application.

The host interface may be a Non-Volatile Memory express (NVMe) interface and configuring the logical address range for debug data may include configuring the logical address range as a NVMe namespace. The NVMe namespace may be secured such that only the debug application in the host can access the NVMe namespace. The method may include storing the debug data in a debug file in the host. The method may include subsequently accessing the debug data from the debug file in the host to debug operation of the data storage device. The method may include configuring the debug command to identify a plurality of logical addresses in the logical address range, the plurality of logical addresses corresponding to a plurality of types of debug data. The plurality of types of debug data may include at least one of: logical-to-physical mapping data, state machine data, error code data, active thread data, controller register data, command history data, and power management data. The debug application may communicate with the data storage device through a driver in the host, the driver additionally configured to manage read and write commands directed to the data storage device for one or more host applications. The driver may be an NVMe driver that is common to all host applications that are in communication with the data storage device.

An example of an apparatus includes: a host interface configured for communication with a host; means for non-volatile storage of user data received from the host; and means for generating debug data and for sending the debug data through the host interface in response to a host command directed to a host logical address range assigned to debug data.

An example of a data storage system includes a non-volatile memory die; a memory controller die coupled to the non-volatile memory die, the memory controller die comprising: a host interface configured for command and data transfer between a host and the non-volatile memory die; a parsing unit configured to identify a command as a debug command according to a logical address in the command; and on-chip debug circuits coupled to the host interface, the on-chip debug circuits configured to send debug data to the host through the host interface, the debug data identified by the logical address in the command.

The apparatus may further include: a host debug application operating in the host; and means for storing the debug data in the host.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A system, comprising:
a host interface;
a set of non-volatile memory cells assigned a first logical address range; and
one or more control circuits coupled to the host interface and coupled to the set of non-volatile memory cells, the one or more control circuits configured to access the set of non-volatile memory cells in response to read and write commands directed to the first logical address range, the read and write commands conforming to a communication protocol, the one or more control circuits further configured to generate debug data and send the debug data through the host interface in response to a command received through the host interface, the command is directed to a second logical address range, the second logical address range assigned exclusively for debug data, the command conforming to the communication protocol.

2. The system of claim 1 wherein the one or more control circuits are configured to generate debug data and send the debug data through the host interface without storing the debug data in the set of non-volatile memory cells.

3. The system of claim 1 wherein the host interface is a Non-Volatile Memory express (NVMe) interface.

4. The system of claim 3 wherein the second logical address range forms an NVMe namespace that is configured as a debug namespace.

5. The system of claim 4 wherein the command includes one or more addresses within the debug namespace corresponding to debug data to be generated.

6. The system of claim 3 wherein the host interface is coupled to a host and the one or more control circuits are configured to communicate with a debug application in the host through an NVMe driver in the host.

7. The system of claim 6 wherein the debug application is configured to receive the debug data and to store the debug data in a debug file in the host.

8. The system of claim 7 further comprising a secure communication link between the debug application and the one or more control circuits.

9. The system of claim 1 wherein the one or more control circuits are configured to generate debug data that includes at least one of: logical-to-physical mapping data, state machine data, error code data, active thread data, controller register data, command history data, and power management data.

10. A method of debugging a data storage device, comprising:
configuring a first logical address range of a data storage device for user data;
configuring a second logical address range of the data storage device for debug data;
receiving read and write commands from a host, through a host interface, the read and write commands directed to the first logical address range, the read and write commands conforming to a communication protocol;
in response to the read and write commands from the host, reading user data from a non-volatile memory and writing user data to the non-volatile memory;
receiving a debug command from a debug application in the host, through the host interface, the debug command directed to the second logical address range, the debug command conforming to the communication protocol;

in response to receiving the debug command directed to the second logical address range, generating debug data in the data storage device; and sending the debug data through the host interface to the debug application.

11. The method of claim 10 wherein the host interface is a Non-Volatile Memory express (NVMe) interface and wherein configuring the logical address range for debug data includes configuring the logical address range as a NVMe namespace.

12. The method of claim 11 wherein the NVMe namespace is secured such that only the debug application in the host can access the NVMe namespace.

13. The method of claim 10 further comprising storing the debug data in a debug file in the host.

14. The method of claim 13 further comprising, subsequently accessing the debug data from the debug file in the host to debug operation of the data storage device.

15. The method of claim 10 further comprising configuring the debug command to identify a plurality of logical addresses in the logical address range, the plurality of logical addresses corresponding to a plurality of types of debug data.

16. The method of claim 15 wherein the plurality of types of debug data include at least one of: logical-to-physical mapping data, state machine data, error code data, active thread data, controller register data, command history data, and power management data.

17. The method of claim 10 whereby the debug application communicates with the data storage device through a driver in the host, the driver additionally configured to manage read and write commands directed to the data storage device for one or more host applications.

18. The method of claim 17 wherein the driver is an NVMe driver that is common to all host applications that are in communication with the data storage device.

19. An apparatus comprising:
a host interface configured for communication with a host;
means for non-volatile storage of user data received from the host; and
means for accessing the means for non-volatile storage in response to read and write commands directed to a user data logical address range, the read and write commands conforming to a communication protocol, and generating debug data and for sending the debug data through the host interface in response to a host command directed to a host logical address range assigned to debug data, the command conforming to the communication protocol.

20. The apparatus of claim 19 further comprising:
a host debug application operating in the host; and
means for storing the debug data in the host.

21. A data storage system, comprising:
a non-volatile memory die;
a memory controller die coupled to the non-volatile memory die, the memory controller die comprising:
 a host interface configured for command and data transfer between a host and the non-volatile memory die;
 a parsing unit configured to identify a command as a debug command or a memory die access command according to a logical address in the command, a first logical address range assigned to the non-volatile memory die and a second logical address range assigned exclusively to debug data; and
on-chip debug circuits coupled to the host interface, the on-chip debug circuits configured to send debug data to the host through the host interface, the debug data identified by the logical address in the command in the second logical address range.

* * * * *